(12) United States Patent
Gallivan et al.

(10) Patent No.: US 7,284,089 B2
(45) Date of Patent: Oct. 16, 2007

(54) DATA STORAGE DEVICE

(75) Inventors: Ian Gallivan, Galway (IE); John McSweeney, Galway (IE); Anita Dore, Galway (IE); Chris Armstrong, Westmeath (IE)

(73) Assignee: YQA Now Limited, Galway (IE)

( * ) Notice: Subject to any disclaimer, the term of this patent is extended or adjusted under 35 U.S.C. 154(b) by 280 days.

(21) Appl. No.: 10/949,326

(22) Filed: Sep. 27, 2004

(65) Prior Publication Data
US 2005/0073899 A1    Apr. 7, 2005

(30) Foreign Application Priority Data
Oct. 1, 2003    (IE)    ................ S2003/0722

(51) Int. Cl.
*G06F 13/14*    (2006.01)
(52) U.S. Cl. ................................... 711/115
(58) Field of Classification Search ............... 711/115; 710/315
See application file for complete search history.

(56) References Cited

U.S. PATENT DOCUMENTS

2003/0221066 A1* 11/2003 Kaneko ............ 711/115
2005/0037647 A1* 2/2005 Le .................. 439/131
2006/0015673 A1* 1/2006 Morrow .............. 710/315

FOREIGN PATENT DOCUMENTS

EP    1 333 531 A1    8/2003

OTHER PUBLICATIONS

Chang et al, "An Adaptive Striping Architecture for Flash Memoy Storage Systems of Embedded Systems", IEEE, 2002.*
European Search Report dated Oct. 7, 2005.

* cited by examiner

*Primary Examiner*—Kevin L. Ellis
(74) *Attorney, Agent, or Firm*—Stevens, Davis, Miller & Mosher, LLP

(57) ABSTRACT

A data storage device comprises a non-volatile, re-writable solid state memory 10 having relatively high and low speed ports 12, 14 allowing data to be written into the memory via the high speed port at a substantially faster speed that it is read out from the low speed port, and a memory control 16 for controlling the writing and reading of data to and from the memory.

11 Claims, 2 Drawing Sheets

DATA STORAGE DEVICE

This invention relates to a data storage device using non-volatile, re-writable solid state ("flash") memory.

According to the present invention there is provided a data storage device comprising a non-volatile, re-writable solid state memory having at least two data ports allowing data to be written into the memory via at least one port at a substantially faster speed than it is read out of the memory via at least one other port, and a memory control for controlling the writing and reading of data to and from the memory.

Preferably the said at least one port provides a sustained transfer rate of at least 60 MBytes/sec and most preferably at least 80 MBytes/sec. Preferably, too, the at least one other port provides a transfer rate at least within the range 1.5 to 5 MBytes/sec. The memory preferably has a capacity of at least 512 Mbyte and most preferably at least 2 Gbytes.

An embodiment of the invention provides a flash storage device functioning as a dual-ported, portable, high capacity data storage device. The dual-ported (two interface) nature of the device allows data to be written into the memory at high speed and read out from the memory at a different, lower speed.

The high speed interface is compliant with the Serial ATA Specification (Serial ATA: High Speed Serialized Attachment, Rev 1.0a, Jan. 7, 2003) and can interface to a S-ATA host. The high speed interface provides a minimum sustained transfer rate of 80 MBytes/sec. The flash storage device can accept 2 GBytes in at least 30 seconds on the high speed interface. The slow speed interface on the flash storage device is compliant with the Secure Digital (SD) Specification (SD Physical Layer Specification, Version 1.01, Apr. 15, 2001) and can interface to an SD host. The slow speed interface provides a minimum transfer rate of 2.5 MBytes/sec. The flash storage device is hot-swappable allowing insertion and removal from live systems without disrupting the operation of those systems (this is inherent in the S-ATA and SD standards).

In use the high speed S-ATA interface on the flash storage device can interface to a large capacity, standalone kiosk style device which is capable of delivering data at speeds of the order 80 MBytes/sec. The kiosk device will be populated with appropriate high value content such as movies. High resolution movie content will require large file sizes. Lower resolution movie content will require smaller file sizes. In both cases (a single large transfer or multiple smaller transfers) the ability to rapidly download the content into the flash storage device via the high speed S-ATA interface allows for kiosk based high value content distribution. The slow speed SD interface on the flash storage device can interface to a playback device that can interpret and display the stored data.

Figure 1:
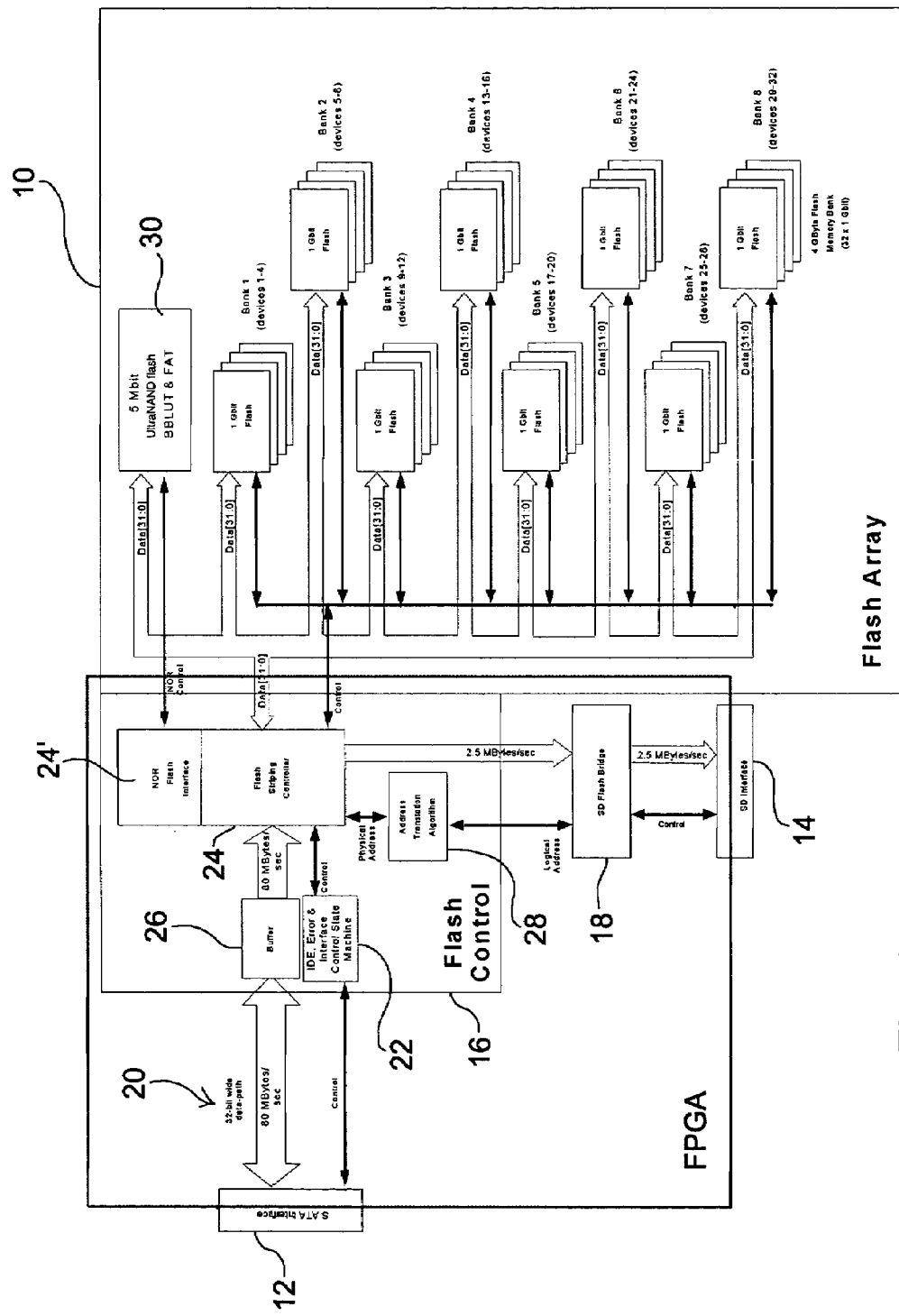
Figure 2:
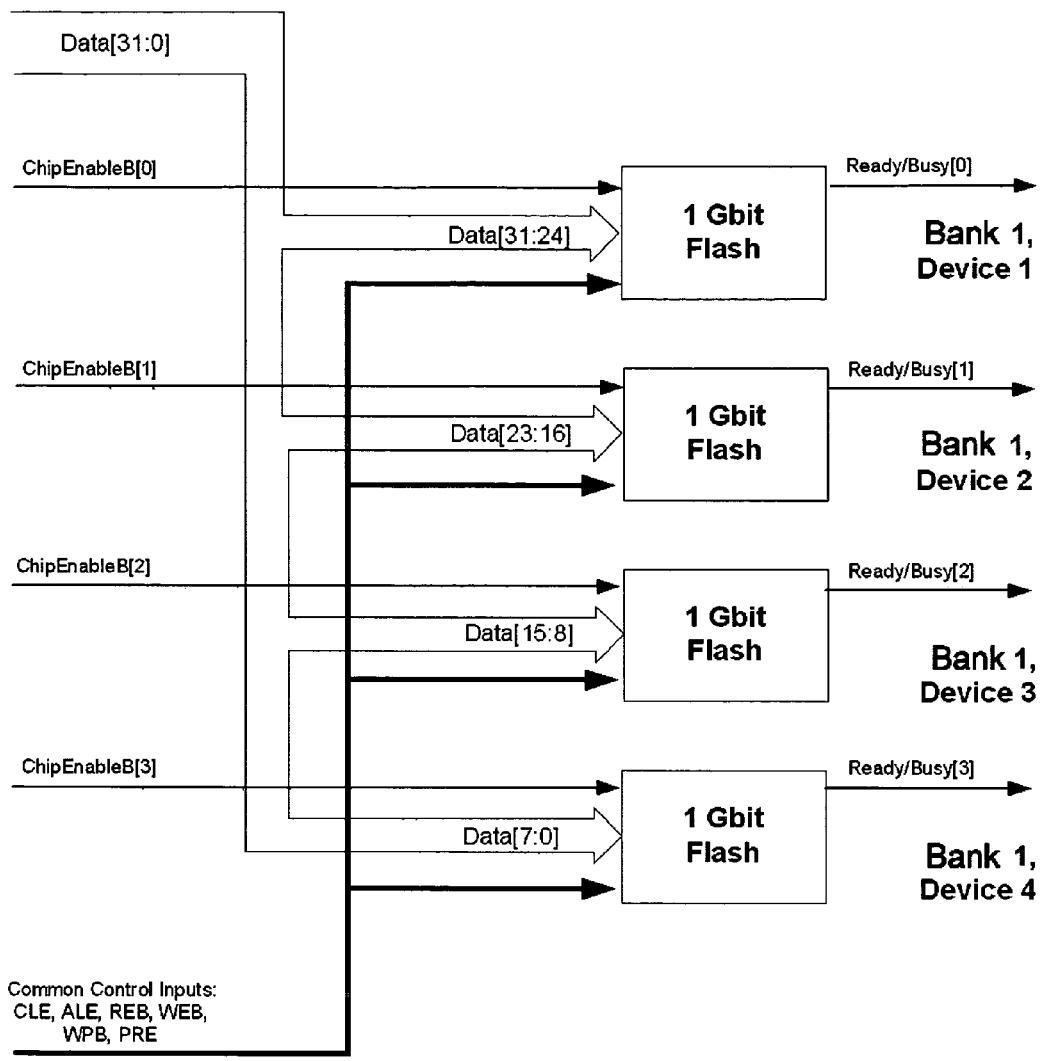

An embodiment of the invention will now be described, by way of example, with reference to the accompanying drawings, in which:

FIG. 1 is a block circuit diagram of a flash storage device according to the invention; and FIG. 2 is a block circuit diagram showing the connections within one of the flash device banks of FIG. 1.

The flash storage device shown in FIG. 1 comprises four main parts: a 4 GByte flash memory array 10, a high speed port in the form of a S-ATA interface 12, a low speed port in the form of an SD interface 14, and memory control circuitry 16. The device also includes an SD-flash bridge 18 to be described later.

The Serial ATA Specification envisages two principle communicating elements: (1) a host which initiates transactions, and (2) a device which responds to host initiated transactions. The flash storage device of FIG. 1 operates as a SATA device as it receives and responds to transactions initiated by a host. To this end the S-ATA interface 12 provides functionality for the Physical, Link and Transport layers of the S-ATA specification. The S-ATA interface 12 receives data and control information from the host over a serial interface. Data and control information is recovered from the serial bit stream and presented to the memory control circuitry 16 over a parallel data/control interface 20 as shown in FIG. 1.

The main objectives of the flash storage device are:

1) To maintain a 80 MBytes/sec throughput rate from the S-ATA interface 12 while writing the data to the flash memory array 10.
2) To support a read back of contiguous data from the flash memory array 10 to either the S-ATA or the SD interface
3) To support a write of data to the flash memory from the SD interface.

The control information from the S-ATA parallel interface 20 is used to determine what type of transaction has been initiated by the host. Depending on the type of transaction, an IDE state machine 22 can resolve all appropriate responses to the transaction itself. The range of possible commands and operations required to be supported by the IDE state machine are dictated by the ATA/ATAPI Specification (ATA/ATAPI-5: AT Attachment with Packet Interface-5, Rev 3, Feb. 29, 2000).

The IDE state machine 22 will respond to and terminate all S-ATA host-initiated commands other than data read and data write transactions. In the case of data read and write transactions, the IDE state machine works with a striping controller 24 (to be described) to facilitate data transfer across the parallel data interface 20 to the flash array 10 via a data buffer 26. In the case of errors over the S-ATA interface 12, the IDE state machine receives a notification of the error condition from the S-ATA interface and will initiate the correct response to terminate the transaction. In the case of data write errors in the flash array 10, notification of the error is received from the striping controller 24 and the IDE state machine 22 will initiate the correct response over the S-ATA interface 12. In the case of data read errors in the flash array 10, notification of the error is received from the striping controller 24 and the IDE state machine 22 will initiate the correct response over the S-ATA interface.

Data buffering 26 is implemented between the S-ATA interface 12 and the striping controller 24. This buffering has three purposes:

1) Gather a good frame of S-ATA data before writing any data to the flash array 10. This ensures that a bad frame is not partially written to the flash array before it is discovered to have CRC errors, etc.
2) Gather the S-ATA data into 512-byte chunks, so that each 512-byte sector is written to a contiguous area inside a flash device (as will be described, the flash array 10 is made up 32 individual 1 GBit flash memory devices arranged in 8 banks of four devices). This makes it easier to read back the data in the right order through the SD interface 14.
3) Resolve the disparity between the S-ATA data transfer rate and the flash array transfer rate. The data transfer rate supported by the Serial ATA parallel interface is greater than that supported by the flash memory array.

The amount of data buffering required can be variable and depends on the following factors:

1) Data transfer granularity on the Serial ATA interface.
2) Data transfer rate from the Serial ATA interface.
3) Data transfer rate into the flash memory array.
4) Page register size for a particular family of flash memory devices.
5) The latency in sending flow control information back to the host device.

These parameters are used to determine the size of the data buffer 26. In this embodiment a buffer size of 1 Mbytes of SRAM is used.

In addition to the data buffer 26 and in conjunction with the IDE state machine 22, flow control is implemented between the flash array 10 and the S-ATA host. This flow control throttles the data rate across the S-ATA interface 12 to a level that can be supported by the write rate of the flash array. During a data write operation initiated by a S-ATA host, write data is transferred via the data bus to the buffer 26 under the control of the IDE state machine 22. The striping controller 24 then manages the transfer of the data from the buffer 26 into the flash array 10. During a data read operation initiated by the S-ATA host, the striping controller 24 manages the fetching of data from the flash array 10 and places it in the buffer 26. The IDE state machine 22 then manages the transfer of the data out of the buffer 26 and into the S-ATA interface 12 via the data bus.

The flash control circuitry 16 and the flash array 10 has one primary purpose: the storage and retrieval of data at a data rate as close to the S-ATA rate as is allowed by the characteristics of the flash media itself. There are several components which achieve this, as follows:

1) The striping controller 24.
2) The arrangement of flash memory devices within the flash array.
3) A bad block look up table (BBLUT): a look up table containing information on the quality of the flash memory devices.
4) The logical to physical mapping: a control element which allows the flash array to resolve an external host's view of the flash bank to the flash array's internal view.

The striping controller 24 facilitates the transfer of data either from the flash array 10 to the buffer 26 on a read operation or from the buffer 26 to the flash array 10 on a write operation. The striping controller has knowledge of the topology of the flash array and knowledge of the type of NAND flash device being used (by design). The striping controller also receives information on the position of unreliable portions of the flash array from the BBLUT. The striping controller takes this topology and bad block information together with the addressing information provided by an address translation algorithm 28 and uses it to store and retrieve data from the flash array 10.

The striping controller resolves the various pieces of control information it receives (bad block information, block address translation) to:

1) Format the address for the flash devices.
2) Provide the correct address sequence as the data transfer moves through the flash array addressing apace.
3) For a data write operation, ensures the correct sequence of data is taken from the buffer 26 and matched with the correct address.
4) For a data read operation, ensures the correct sequence of data is extracted from the flash array for the addresses provided and is placed into the buffer 26.
5) For data transfer operations on the SD interface 14, the striping controller can accept data on a write or present data on a read directly to the SD-flash bridge 18.

The flash array 10 consists of an arrangement of non-volatile solid state re-writable memory devices. There are two types of flash memory devices within the flash array 10. The great majority of the memory is of a type called NAND flash and is used as the main data store. A small percentage 30 of the flash memory is of a type sold under the name UltraNAND flash which is 100% known good memory and, as will be described, is used to store critical control information (alternative types of known good memory that can be used are NOR flash and SuperAND flash). The flash striping controller 24 contains selection logic to determine whether reads from the flash array 10 are for the main NAND flash or the UltraAND flash 30 to provide the required read data.

The S-ATA interface 12 is capable of delivering data at rate close to the theoretical maximum support by the Serial ATA specification of 150 Mbytes/sec. The current generation of flash memory devices have a maximum write speed of between 5 Mbytes and 10 Mbytes per second to a single device. NAND flash technology uses a technique called register mode access to facilitate speeding up read and write access to flash memory.

In order to maximize the data throughput, a certain topology of flash memory devices has been chosen for the present embodiment. This topology is based on:

Striping Techniques
Arrangement of Flash Devices
Max Page Program Times/Cache Program
Throughput calculations using max page program times
Use of UltraNAND flash Striping is a mechanism of achieving parallelism in the arrangement of multiple flash devices that allows that arrangement to support data transfer rates greater than that of a single flash device. There are two types of striping, disk striping and data striping.

Disk striping is a technique for spreading data over multiple storage devices to meet performance goals. The data is broken into units and spread across the available storage units. This technique is normally used within RAID systems but can be used for any storage device. In this embodiment flash memory devices are used instead of hard disk drives. Data striping is the segmentation of logically sequential data, such as a single file, so that segments can be written to multiple physical storage devices in a round-robin fashion. This technique is useful if the processor is capable of reading or writing data faster than a single disk can supply or accept it. While data is being transferred from the first disk, the second disk can locate the next segment.

The following architecture used in the present embodiment combines a mixture of disk striping and data striping techniques.

In the flash array 10, and as shown in FIG. 1, a 4 Gbyte configuration of flash memory is organized into 8 banks (Banks 1-8) each containing four individual 1 GBit flash devices. The 32-bit data bus from the S-ATA interface is split into 4 across the 4 devices in each bank. Thus the striping controller 24 stripes data across the 4 devices in each bank, similar to the disk striping technique.

The striping controller 24 takes advantage of the setup and execution nature of the page program operation. It sets up the page program operation for the first bank of 4 flash devices, then while these 4 devices are going through their execution phase, it moves on to the next 4 devices and sets them up for page program operations, and so on. When the last bank of 4 has been setup for page program, the striping controller moves back to the first bank of 4 again. So the striping controller writes to the 8 banks in a round-robin fashion similar to the data-striping technique.

FIG. 2 illustrates in greater detail the connections to the four devices inside each of the eight banks. Bits [31:24] of the address/data/command bus from the striping controller are connected to the 8-bit address/data/command bus of the first device in each bank. Likewise, bits [23:16] are connected to the second device in each bank, bits [15:8] are connected to the third device in each bank and bits [7:0] are connected to the last device in each bank. The 5 control inputs (CLE, ALE, RE, WE, WP) to each of the 4 flash devices within a bank can all be tied together, as all 4 devices within a bank are written together in parallel. Each of the 32 devices has its own separate chip enable (CE), as the devices are read one at a time by the SD interface 14.

Flash devices have a critical performance parameter which determines the time from which a device has accepted data to the point at which it can next accept data. This is known as the programming time. This parameter varies as a result of the silicon manufacturing process. The arrangement of flash devices implies that the write performance can be affected by the maximum programming time of the slowest device in the array. For example the range of programming times possible with Samsung 1 Gbit NAND flash devices (Part No. K9F1G08U0M ranges from a typical of 300 uS to 700 uS maximum. A solution to this problem can be fashioned by a combination of varying the array topology and using the cache programming features inherent in the flash device.

The solution to this problem in the present embodiment is to use 32×1 Gbit Samsung devices instead of 16 (i.e. a total storage of 4 Gbytes), but only use half the storage space in each 1 GBit flash device. The throughput rate of 80 MBytes/sec can definitely be achieved this way even using the max page program time of 700 us.

Given the "mostly good memory" nature of NAND flash, there has to be an area within the flash array 10 where there is 100% good memory. This is required for critical control information that needs to be immediately available upon power up. As mentioned earlier a minor percentage of UltraNAND flash 30 is used to implement known good flash memory.

Critical information for the flash array 10 is:
1) The File Allocation Table (FAT) which acts as the master index for the data content.
2) The bad block information.
3) Any FPGA (see below) or device programming code.

A 1 Mbyte area of the memory map is allocated to the UltraNAND flash 30 and a separate UltraNAND control interface 24' is built into the striping controller 24.

A logical interface is required for the striping controller 24 to control the reading of data out of the flash array and to present it in the format required by the SD interface 14. The striping controller (in conjunction with the BBLUT and address translation algorithm 28) resolves the physical address for the required logical block read address sent by the SD host. It then reads the data out of the appropriate flash device, and sends the read data to the SD interface 14. The SD interface then transmits the read data back to the SD host over the 4-bit data bus according to the SD specification.

The SD-flash Bridge 18 acts as the link between the SD interface 14 and the striping controller 24 to ensure the address, data and control information is presented in the correct format to:
1) Allow the striping controller to interpret SD data transfer requests and work with the flash array.
2) Allow the SD interface to accept the read data required from the flash array for a read transfer.
3) Allow the SD interface to deliver the write data required for the flash array for a write transfer.

The transfer rate required for reads on the SD port (2.5 MBytes/sec) is much lower than is required for writes from the S-ATA port (80 MBytes/sec). Therefore, the flash devices do not have to be accessed four at a time as previously described. Instead, the flash devices in each bank can be read one at a time.

If the 512-byte sectors from the S-ATA host were written contiguously into flash memory (i.e. four 512-byte sectors stored in each 2048-byte page), then the reading of the data is easier than if each sector from the S-ATA host were striped across multiple flash devices. Data must be read out one page (2,048 bytes) at a time from NAND flash devices. Page read operations to NAND flash devices consist of a setup phase and an execution phase, similar to page program operations:

During the setup phase, the address of the page to be read is written to the address register (inside the flash device) via the IO[7:0] bus. The page address is presented as four bytes of row and column information.

When the read command is executed the execution phase of the page read begins. There is a delay to when the first byte of read data appears from a NAND flash device on its IO[7:0] bus. After this initial latency one byte of read data is presented by a NAND flash device on its IO[7:0] bus every time the read enable (RE) pin on the flash device is pulsed.

Flash Vendors recommend that an ECC check is performed after a page read i.e. that the ECC should be calculated and checked against the ECC code which was stored in the spare bytes in the page when the page was written. Single-bit ECC errors during reads can be corrected in this way.

NAND flash operates on a principle of mostly good memory (MGM). Some blocks within the memory core are bad on delivery from the manufacturer and some go bad over the lifetime of the device. In order to avoid erroneous data writes and reads a form of bad block management is implemented.

The SD host accesses data from the flash array 10 by using logical block addresses (LBA). The sector size is 512 bytes. The SD host does not know how the data is physically stored in the flash array. Therefore, an interface is implemented to map the logical addresses to physical addresses. The S-ATA host also accesses data using LBAs. Sector size is 512 bytes. The S-ATA transport core presents this information on address port of the S-ATA interface.

The present embodiment addresses the requirements for logical-physical mapping on the SD port, and bad block management, in the following way.
1) When the flash devices are delivered from the manufacturer, an initial profiling is done to record the locations of the bad blocks. The addresses of the bad blocks for each of the 32 flash devices are stored in the Bad Block Look-Up Table (BBLUT). The BBLUT is stored in NOR flash 30.

2) The striping controller 24 writes the 512-byte sectors to each bank of four flash devices in a round-robin fashion as described. Each 2048-byte page in flash will store four 512-byte sectors.

3) The striping controller 24 checks the BBLUT each time it is about to write to the flash bank—if it finds that there is a bad block at the address it is about to write to, it writes to the next good address in that flash device instead. This ensures that bad blocks are mapped out during writes to the flash bank.

4) The striping controller leaves about 5% headroom in each flash device in case it contains bad blocks. This makes the striping simpler, i.e. the data can still be written to the intended flash device and does not have to be moved to a different flash device if bad blocks are encountered.

5) The striping controller checks the status of each write to the flash bank. If further 10 bad blocks develop in the flash bank over time (other than the ones present when the flash devices are delivered from the manufacturers), the flash device will indicate during the status check that the write has failed. The striping controller then updates the BBLUT with the address of the block which has now turned bad. It then indicates to the S-ATA host that the transmission of the data download has failed and should be restarted.

5) When the SD host requests a read from a particular LBA, the address translation algorithm 28 translates the requested LBA into a physical address location in the flash bank. The address translation algorithm performs the translation on-the-fly using its knowledge of how the striping algorithm performed the writes in conjunction with information from the BBLUT. Entries in the BBLUT will cause an address offset to be added onto the calculated address. This ensures that bad blocks are mapped out during reads from the flash bank.

6) A bad block in one of the 32 flash devices will only cause the block in that particular flash device to be mapped out, it does not mean that all blocks at that address across all thirty two devices need to be mapped out. This can be achieved if the BBLUT is organized into 32 areas i.e. a list of bad blocks per individual device.

The Secure Digital (SD) Memory Card specification envisages two communicating elements: (1) a host which initiates transactions, and (2) a device which responds to host initiated transactions. The slow speed interface on the flash storage device operates as an SD Memory Card device and needs to be able to communicate with standard SD hosts. SD Memory Card communication is based on a 9-pin interface (Clock, Command, 4 Data lines and 3 Power/Ground lines) and is designed to operate at operating frequency of between 0 and 25 MHz and at a low voltage range. The data and command lines are bi-directional.

The SD interface 14 presents control, address and data ports. The logical address of the data being read or written is presented on the address port. The nature of the transaction (read or write) is presented on the control port. The SD-flash bridge 18 working with the striping controller and the logical to physical address mapping interprets the address presented on the address port to resolve a physical address within the flash bank from which data is read for a read transaction and to which data is written for a write transaction. All data transfer transactions are initiated by the SD host.

In the implementation of the flash memory device, the flash array 10 consists of commercial off the shelf Samsung devices as identified above. The memory control circuitry 16 and SD-flash bridge 18 is implemented by a Field Programmable Gate Array (FPGA) as indicated by the correspondingly labelled box enclosing these components in FIG. 1. It will be seen that the FPGA box passes through the S-ATA and SD interfaces 12 and 14. This is to indicate that the FPGA implements the interface logic of the S-ATA and SD interfaces, the portions of these interfaces lying outside the FPGA box in FIG. 1 representing the respective physical connectors of these interfaces. The functions of the FPGA may alternatively be implemented by an application specific integrated circuit (ASIC) which would consume less power than an FPGA. Due to the small dimensions of the constituent components the entire device represented in FIG. 1 can be housed in a small, hand-held package having dimensions less than or equal to those of a PCMCIA-II volume. In such a case the SD and S-ATA connectors will be at opposite ends of the package.

If desired, the flash storage device can be provided with the capability of implementing the required hardware and software components for a particular security and access control model. The hardware & software components will be chosen to ensure the correct interpretation and implementation of a Rights Expression Language (REL).

Although the foregoing has described a device having a single high speed port and a single low speed port, other arrangements are possible. One could use a different number and type of high speed port; for example, two Gigabit Ethernet ports will perform as fast as a S-ATA port. So a tri-port device using three ports (2 Gigabit Ethernet ports for writing/control and one SD for reading) provides the same usability and performance as the embodiment described above. Similarly, one could use a different number and type of slow speed port. For example, two USB interfaces could be used, again giving a tri-port device with the same usability and performance as the described device. In each case the memory control would be adapted to manage the two high speed or low speed ports.

The invention is not limited to the embodiment described herein which may be modified or varied without departing from the scope of the invention.

The invention claimed is:

1. A data storage device comprising a non-volatile, re-writable solid state memory having at least two data ports allowing data to be written into the memory via at least one port at a substantially faster speed than it is read out of the memory via at least one other port, and a memory control for controlling the writing and reading of data to and from the memory, wherein the solid state memory comprises a plurality of individual memory devices organised into groups, and wherein the memory control is arranged to write data into the memory cyclically into the groups and in parallel into the individual memory devices within each group.

2. A data storage device as claimed in claim 1, wherein the said at least one port provides a sustained transfer rate of at least 60 MBytes/sec and preferably at least 80MBytes/sec.

3. A data storage device as claimed in claim 2, wherein the said at least one port is compliant with the Serial ATA Specification.

4. A data storage device as claimed in claim 1, wherein the said at least one other port provides a transfer rate at least within the range 1.5 to 5 MBytes/sec.

5. A data storage device as claimed in claim 4, wherein the said at least one other port is compliant with the Secure Digital Specification.

6. A data storage device as claimed in claim 1, wherein the memory has a capacity of at least 512 Mbyte and preferably at least 2 Gbytes.

7. A data storage device as claimed in claim 1, wherein the memory control organises input data into blocks whose size is less than the page size of each memory device, each block of data being written into a contiguous area of a memory device.

8. A data storage device as claimed in claim 7, wherein only a part of each memory device is available for the storage of data.

9. A data storage device as claimed in claim 7, wherein the memory primarily comprises NAND memory but includes a minor part of known good memory containing control data.

10. A data storage device as claimed in claim 1, wherein the device is hot-swappable.

11. A data storage device as claimed in claim 1, wherein the device is housed in a hand-held package with port connectors at opposite ends of the package.

* * * * *